US009508445B2

(12) United States Patent
Lim

(10) Patent No.: US 9,508,445 B2
(45) Date of Patent: Nov. 29, 2016

(54) SEMICONDUCTOR DEVICE AND READ OPERATION METHOD INCLUDING A SOURCE LINE CHECK CIRCUIT

(71) Applicant: SK hynix Inc., Gyeonggi-do (KR)

(72) Inventor: Sang Oh Lim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/678,601

(22) Filed: Apr. 3, 2015

(65) Prior Publication Data

US 2016/0125949 A1    May 5, 2016

(30) Foreign Application Priority Data

Nov. 4, 2014 (KR) .................... 10-2014-0152398

(51) Int. Cl.
*G11C 16/02* (2006.01)
*G11C 16/04* (2006.01)
*G11C 16/28* (2006.01)
*G11C 11/56* (2006.01)
*G11C 29/02* (2006.01)
*G11C 16/24* (2006.01)

(52) U.S. Cl.
CPC ........... *G11C 16/28* (2013.01); *G11C 11/5642* (2013.01); *G11C 16/0483* (2013.01); *G11C 29/021* (2013.01); *G11C 29/025* (2013.01); *G11C 16/24* (2013.01); *G11C 2211/5648* (2013.01)

(58) Field of Classification Search
CPC ... G11C 16/24; G11C 16/28; G11C 16/0483; G11C 11/5642; G11C 29/021; G11C 29/025; G11C 2211/5648
USPC ............................ 365/185.11, 185.24, 185.26
See application file for complete search history.

(56) References Cited

U.S. PATENT DOCUMENTS

| 5,815,434 | A  | * | 9/1998  | Hasbun ............... | G11C 11/5621 365/185.03 |
|-----------|----|---|---------|----------------------|-------------------------|
| 7,656,710 | B1 | * | 2/2010  | Wong ................. | G11C 11/5628 365/185.18 |
| 8,760,928 | B2 | * | 6/2014  | Chen ..................... | G11C 16/06 365/185.17 |
| 9,224,474 | B2 | * | 12/2015 | Lue ..................... | G11C 16/10 |
| 2005/0047190 | A1 | * | 3/2005 | Kang ..................... | G11C 7/18 365/145 |
| 2007/0147113 | A1 | * | 6/2007 | Mokhlesi ............... | G11C 16/28 365/185.03 |
| 2008/0056005 | A1 | * | 3/2008 | Aritome ............... | G06F 11/1068 365/185.21 |
| 2009/0003076 | A1 | * | 1/2009 | Yun ....................... | G11C 16/26 365/185.21 |
| 2009/0109743 | A1 | * | 4/2009 | Goda ..................... | G11C 11/5628 365/185.03 |
| 2009/0196097 | A1 | * | 8/2009 | Cho ..................... | G11C 11/5642 365/185.03 |
| 2010/0034018 | A1 | * | 2/2010 | Yang ..................... | G11C 11/5642 365/185.2 |

(Continued)

*Primary Examiner* — Vu Le
*Assistant Examiner* — Sung Cho
(74) *Attorney, Agent, or Firm* — IP & T Group LLP

(57) ABSTRACT

An operating method of a semiconductor device includes applying a read voltage to a selected word line of a selected memory block, among a plurality of memory blocks including cell strings coupled between bit lines and a source line, detecting a voltage of the source line by forming a channel in cell strings of the selected memory block, comparing the voltage of the source line with a reference voltage corresponding to the selected memory block, and performing a least significant bit (LSB) read operation on memory cells coupled to the selected word line when the voltage of the source line is greater than the reference voltage, as a result of the comparing, and performing a most significant bit (MSB) read operation on the memory cells when the voltage of the source line is less than the reference voltage, as the result of the comparing.

15 Claims, 6 Drawing Sheets

(56) References Cited

U.S. PATENT DOCUMENTS

| | | | | |
|---|---|---|---|---|
| 2010/0284226 A1* | 11/2010 | Noh | ............... | G11C 5/147 |
| | | | | 365/185.22 |
| 2012/0057409 A1* | 3/2012 | Lee | ............... | G11C 7/1048 |
| | | | | 365/185.25 |
| 2012/0275224 A1* | 11/2012 | Park | ............... | G11C 11/5628 |
| | | | | 365/185.11 |
| 2013/0173857 A1 | 7/2013 | Cheon et al. | | |
| 2014/0010019 A1 | 1/2014 | Kim | | |

\* cited by examiner

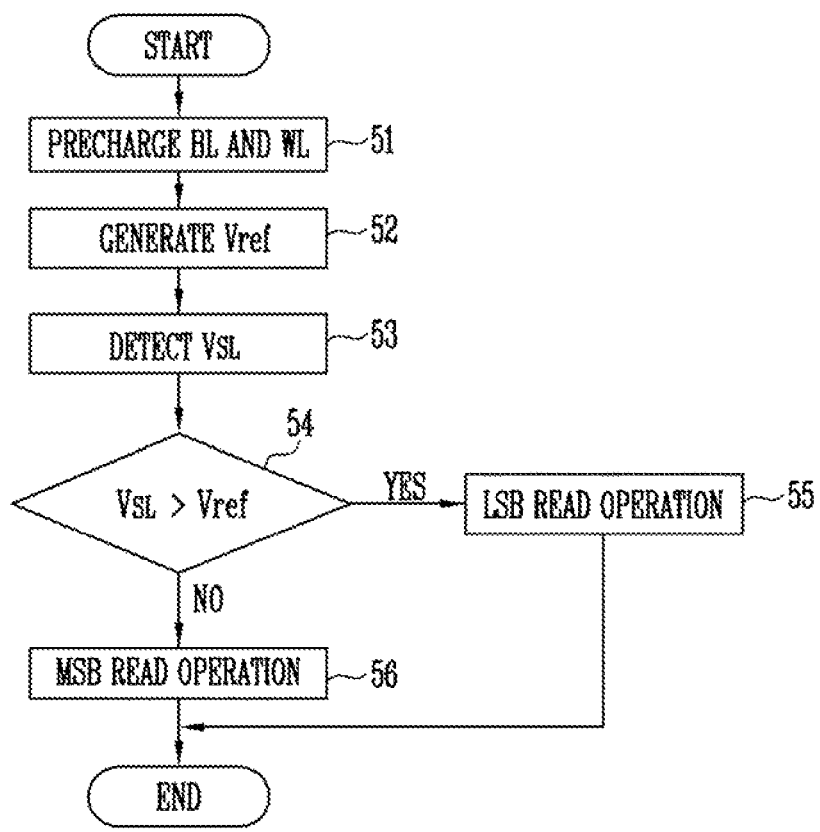

SEMICONDUCTOR DEVICE AND READ OPERATION METHOD INCLUDING A SOURCE LINE CHECK CIRCUIT

CROSS-REFERENCE TO RELATED APPLICATION

The present application claims priority to Korean patent application number 10-2014-0152398, filed on Nov. 4, 2014, the entire disclosure of which is herein incorporated by reference in its entirety.

BACKGROUND

1. Field of Invention

Various exemplary embodiments generally relate to a semiconductor device and an operating method thereof and, more particularly, to a read operation method of a semiconductor device including a source line voltage detection circuit.

2. Description of Related Art

A semiconductor device includes a plurality of memory cells that store data. The memory cells include normal memory cells storing general data and flag cells storing various types of data necessary for the semiconductor device to operate.

A single level cell (SLC) is a memory cell in which one bit of data is stored. A multi-level cell (MLC) is a memory cell in which two or more bits of data are stored. The single level cell may be divided into an erase state or a program state based on a threshold voltage distribution. The multi-level cell may be divided into an erase state or one of a plurality of program states based on a threshold voltage distribution.

When the multi-level cell is programmed, a least significant bit (LSB) program operation and a most significant bit (MSB) program operation may be performed to reduce the width of the threshold voltage distribution. Data indicating whether the LSB program operation or the MSB program operation is performed (hereinafter, "LSB/MSB completion data") is stored in the flag cells of each page. A page may refer to a group of memory cells coupled to the same word line.

When LSB/MSB completion data is stored in the flag cells, the LSB/MSB completion data of the flag cells may be read first during a read operation of a page including the flag cells, and it may be determined from the read data whether the LSB program operation or the MSB program operation is completely performed on the page.

However, since each page includes the flag cells storing the LSB/MSB completion data, there is a limit to how much the size of a memory cell array may be reduced.

SUMMARY

An embodiment is directed to a semiconductor device capable of performing a read operation by using voltage or current of a source line instead of LSB/MSB completion data (i.e., without using flag cells storing LSB/MSB completion data), and an operating method thereof.

An operating method of a semiconductor device according to an embodiment of the present invention may include applying a read voltage to a selected word line of a selected memory block, among a plurality of memory blocks including cell strings coupled between bit lines and a source, line, detecting a voltage of the source line by forming a channel in cell strings of the selected memory block, comparing the voltage of the source line with a reference voltage corresponding to the selected memory block, and performing a least significant bit (LSB) read operation on memory cells coupled to the selected word line when the voltage of the source line is greater than the reference voltage, as a result of the comparing, and performing a most significant bit (MSB) read operation on the memory cells when the voltage of the source line is less than the reference voltage, as the result of the comparing.

An operating method of a semiconductor device according to an embodiment of the present invention include applying a read voltage to a selected word line of a selected memory block, among a plurality of memory blocks including cell strings coupled between bit lines and a source line, detecting a current of the source line by forming a channel in cell strings of the selected memory block, comparing the current of the source line with a reference current corresponding to the selected memory block, and performing a least significant bit read (LSB) operation on memory cells coupled to the selected word line when the current of the source line is greater than the reference current, as a result of the comparing, and performing a most significant bit (MSB) read operation on the memory cells when the current of the source line is less than the reference current, as the result of the comparing.

A semiconductor device according to an embodiment of the present invention may include a plurality of memory blocks including a plurality of cell strings coupled between bit lines and a source line, a peripheral circuit suitable for performing program, read and erase operations on a selected memory block, among the plurality of memory blocks, a source line check circuit suitable for measuring a voltage or current of the source line, comparing the voltage or current of the source line with a reference voltage or current, and outputting a comparison result during the read operation of the selected memory block, among the plurality of memory blocks, and a control circuit suitable for controlling the source line check circuit to compare the reference voltage or current of the selected memory block with the voltage or current of the source line and controlling the peripheral circuit to perform the read operation on the selected memory block based on the comparison result.

BRIEF DESCRIPTION OF THE DRAWINGS

FIG. 5 is a flowchart illustrating a read operation according to an embodiment;

FIG. 6 is a view illustrating a reference voltage;

DETAILED DESCRIPTION

Figure 1:
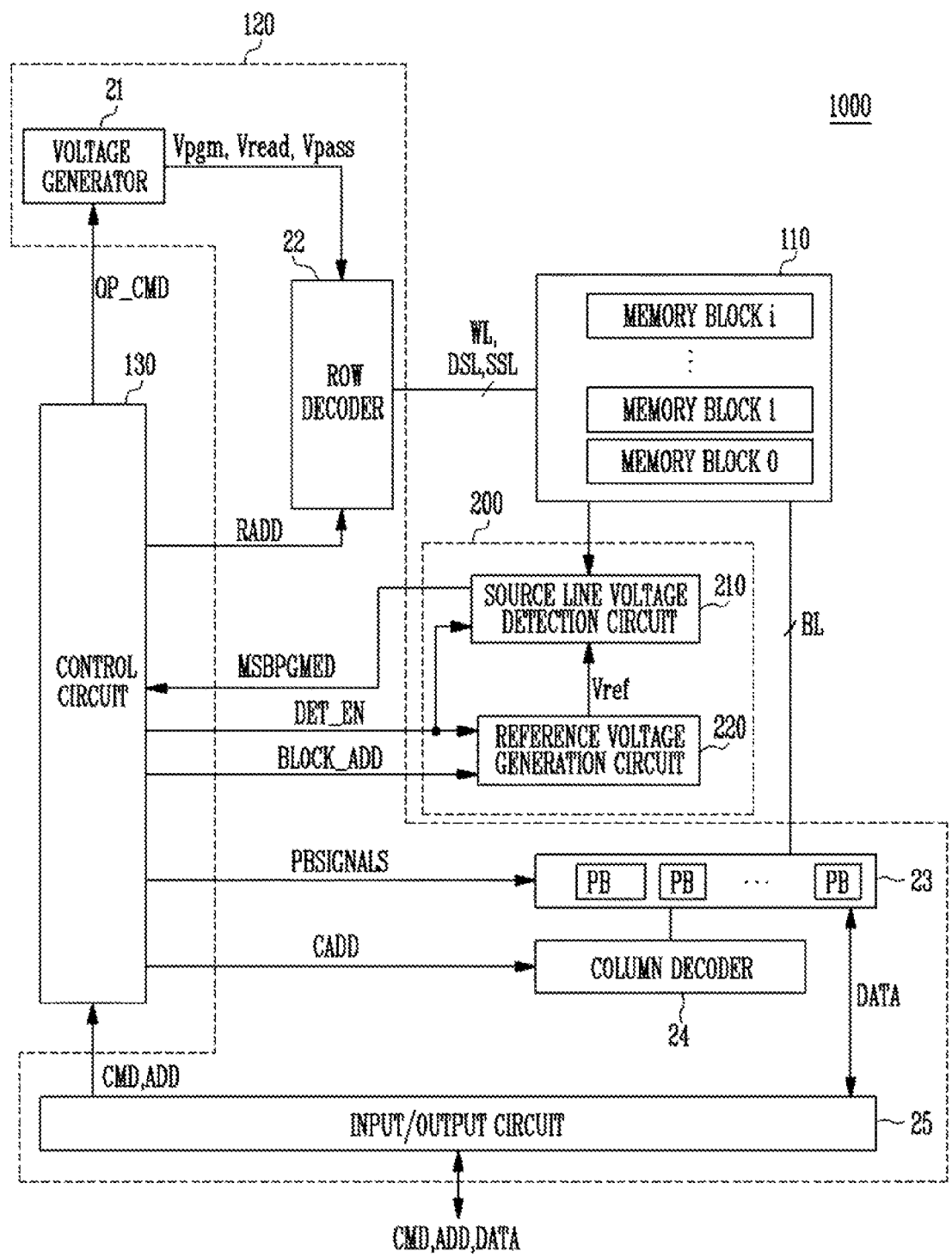
FIG. 1 is a block diagram illustrating a semiconductor device according to an embodiment.

Hereinafter, various exemplary embodiments of the present invention will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the drawings, thicknesses and lengths of components may be exaggerated for convenience of illustration. In the following description, a detailed explanation of related functions and constitutions may be omitted for simplicity and conciseness of explanation. Like reference numerals refer to like elements throughout the specification and drawings.

FIG. 1 is a view illustrating a semiconductor device 1000 according to an embodiment.

Referring to FIG. 1, the semiconductor device 1000 may include a memory cell array 110, a peripheral circuit 120, a source line check circuit 200 and a control circuit 130. The memory cell array 110 may store data. The peripheral circuit 120 may perform program, read and erase operations on the memory cell array 110. The source line check circuit 200 may measure voltage or current of a source line, compare the measured voltage or current of the source line with reference voltage or current, and output a comparison result during a read operation. The control circuit 130 may control the peripheral circuit 120 and the source line check circuit 200. As described above, the voltage or current of the source line may be used. However, according to this embodiment, an apparatus and method of using a voltage of a source line is described for a simplified explanation.

The memory cell array 110 may include zeroth to i-th memory blocks having the same configuration. The configuration of the memory cell array 110 is described below in detail with reference to FIG. 2.

The peripheral circuit 120 may include a voltage generator 21, a row decoder 22, a page buffer group 23, a column decoder 24 and an input/output circuit 25.

The voltage generator 21 may generate operating voltages having various levels in response to an operating command signal OP_CMD. The operation command signal OP_CMD may include a program command signal, a read command signal and an erase command signal. For example, the voltage generator 21 may generate a program voltage Vpgm, a read voltage Vread, a pass voltage Vpass, and other voltages having various levels.

The row decoder 22 may select one of the memory blocks included in the memory cell array 110 in response to a row address RADD, and transfer the operating voltages to word lines WL, drain selection lines DSL and source selection lines SSL coupled to a selected memory block.

The page buffer group 23 may include a plurality of page buffers PB coupled to the memory blocks through bit lines BL, and temporarily store data of a selected page in latches in response to page buffer control signals PBSIGNALS during program, read and erase operations.

The column decoder 24 may exchange data with the page buffer group 23 in response to a column address CADD.

The input/output circuit 25 may transfer a command signal CMD and an address ADD, which are transferred from an external device, to the control circuit 130, transfer externally transferred data DATA to the page buffer group 23, and output data DATA, transferred from the page buffer group 23, to an external device.

The source line check circuit 200 may include a source line voltage detection circuit 210 and a reference voltage generation circuit 220.

The reference voltage generation circuit 220 may generate a reference voltage Vref corresponding to the selected memory block in response to a detection enable signal DET_EN and a block address BLOCK_ADD. The reference voltage Vref may vary for memory blocks. In this connection, the reference voltage generation circuit 220 may include a storage unit for storing data relating to the reference voltage Vref corresponding to each memory block.

The source line voltage detection circuit 210 may detect the voltage of the source line (hereinafter, "source line voltage") of the memory cell array 110 in response to the detection enable signal DET_EN compare the reference voltage Vref with the source line voltage, and output a program state signal MSBPGMED as a comparison result.

The control circuit 130 may output the operating command signal OP_CMD, the row address RADD, the detection enable signal DET_EN, the block address BLOCK_ADD, the page buffer control signals PBSIGNALS and the column address CADD to control the peripheral circuit 120 in response to the command signal CMD and the address ADD.

The control circuit 130 may output the detection enable signal DET_EN to the source line voltage detection circuit 210 and the reference voltage generation circuit 220 at the same time, and output the block address BLOCK_ADD corresponding to the selected page to the reference voltage generation circuit 220 for the read operation of the selected page of the selected memory block. Subsequently, the control circuit 130 may control the peripheral circuit 120 in response to the program state signal MSBPGMED outputted from the source line voltage detection circuit 210 so that the read operation may be performed on the selected page of the selected memory block. For example, the control circuit 130 may determine whether the selected page is in an erase state, a least significant bit (LSB) program state, or a most significant bit (MSB) program state in response to the program state signal MSBPGMED, and set operating conditions for each of the states to thereby control the peripheral circuit 120.

The above-described memory cell array 110 described below in detail.

Figure 2:
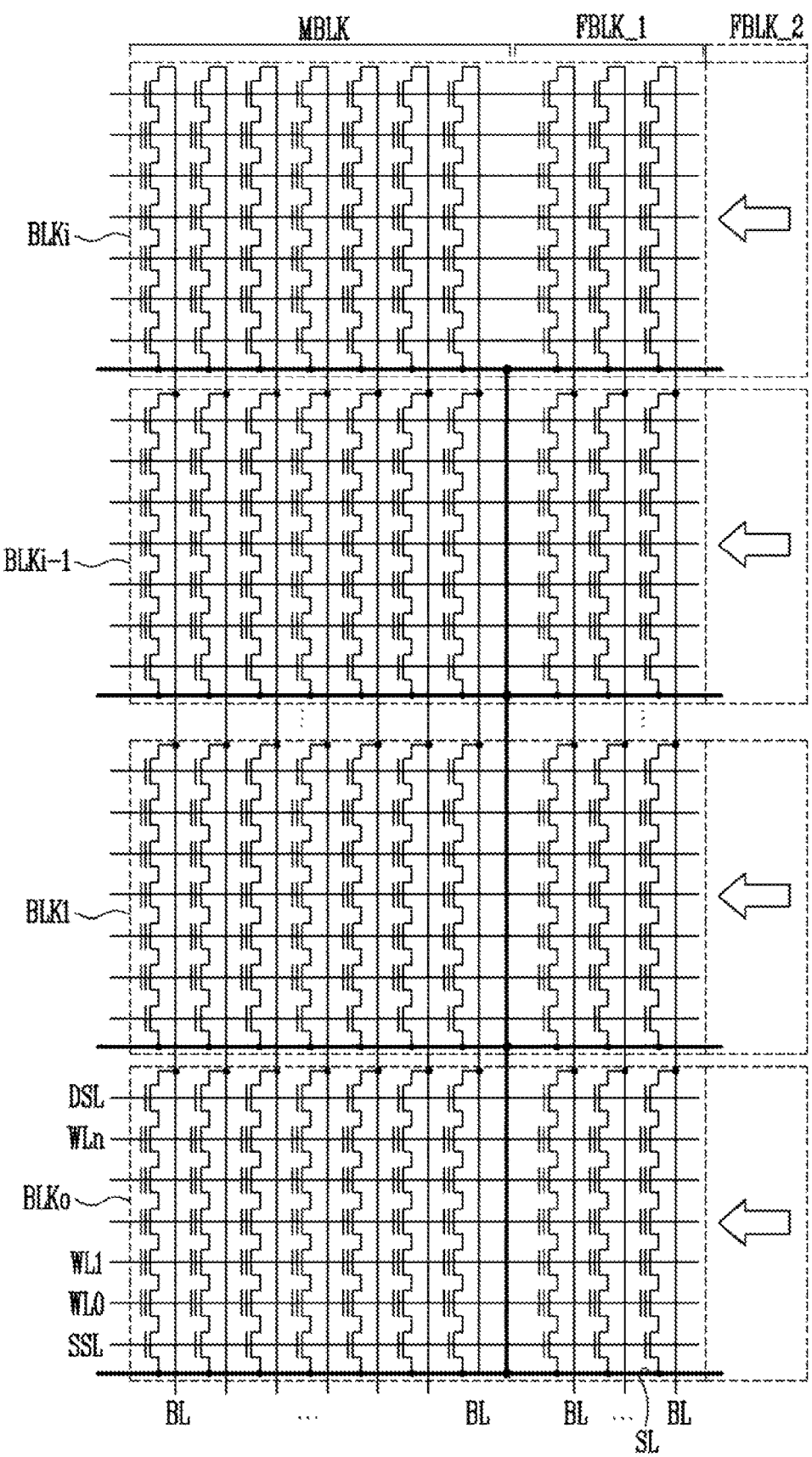
FIG. 2 is a detailed circuit diagram of a memory cell array shown in FIG. 1.

FIG. 2 is a detailed circuit diagram of the memory cell array 110 shown in FIG. 1.

Referring to FIG. 2, the memory cell array may include zeroth to i-th memory blocks BLK0 to BLKi. The zeroth to i-th memory blocks BLK0 to BLKi may share a source line SL. The zeroth to i-th memory blocks BLK0 to BLKi may be configured in substantially the same manner as each other. Each of the zeroth to i-th memory blocks BLK0 to BLKi may include a main block MBLK and a flag block FBLK_1. The structure of the zeroth memory block BLK0 is described below in detail as an example of the memory blocks of the memory cell array 110.

The zeroth memory block BLK0 may include a plurality of cell strings coupled between the bit lines BL and the source line SL. Each of the cell strings may include a source selection transistor, memory cells and a drain selection transistor. Gates of source selection transistors included in different cell strings may be coupled to the source selection line SSL, and gates of drain selection transistors included in the different cell strings may be coupled to the drain selection line DSL. Gates of memory cells included in the different cell strings in a row may be coupled to one of the word lines WL0 to WLn. A group of memory cells coupled to the same word line may be referred to as a page. Some of the plurality of cell strings may be included in the main block MBLK, and others may be included in the flag block FBLK_1. The memory cells included in the main block MBLK may be referred to as main cells, and the memory cells included in the flag block FBLK_1 may be referred to as flag cells. Data that is used by a user may be stored in the main cells, and data that is used in the semiconductor device may be stored in the flag cells. For example, data relating to program, read and erase operations may be stored in the flag cells. However, according to an embodiment, LSB/MSB completion data (data indicating whether an LSB program operation or an MSB program operation is performed) is not used, and the flag cells used to store the corresponding data may be unnecessary.

Since each of the zeroth to i-th memory blocks BLK0 to BLKi does not include flag cells for the LSB/MSB completion data, the size of the memory cell array 110 may be reduced.

Each of the above-described memory cells may be divided into a single level cell (SLC) or a multi-level cell (MLC), depending on the number of bits to be stored. The single level cell (SLC) may refer to a memory cell in which one bit of data is stored. The multi-level cell (MLC) may refer to a memory cell in which two or more bits of data are stored. Since the number of bits of data stored in a single cell is increasing, the multi-level cell (MLC) may refer to a memory cell in which two bits of data are stored. In addition, a memory cell in which three bits of data are stored may be defined as a triple level cell (TLC), and a memory cell in which four bits of data are stored may be defined as a quadruple level cell (QLC). The present invention is applicable to the multi-level cell (MLC), the triple level cell (TLC) and the quadruple level cell (QLC). However, the multi-level cell (MLC) is described below as an example for a simplified explanation.

Figure 3:
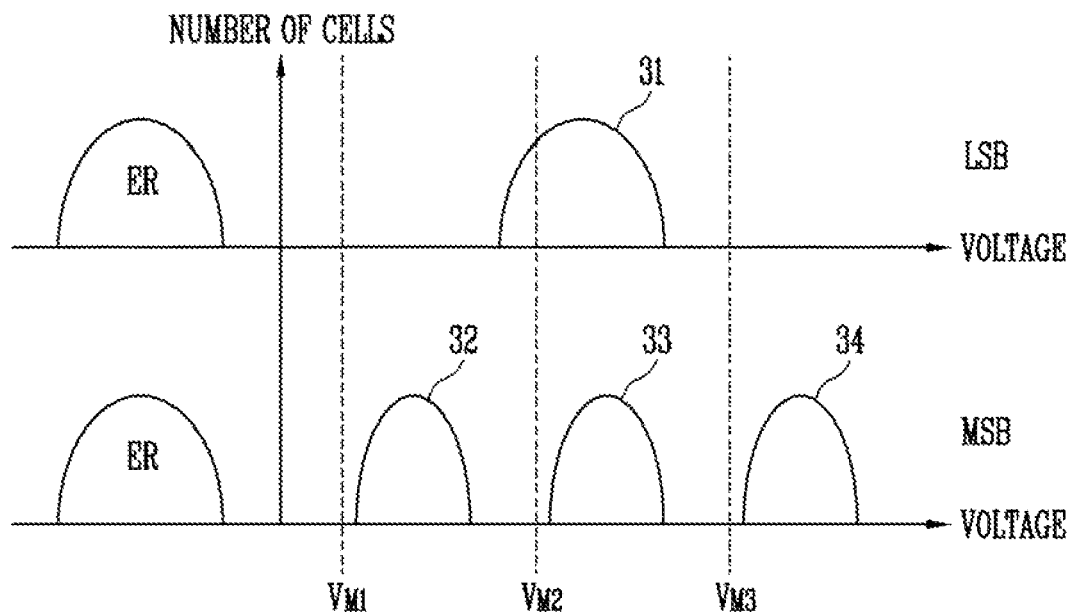
FIG. 3 is a view illustrating a threshold voltage distribution of a multi-level cell.

FIG. 3 is a view illustrating a threshold voltage distribution of a multi-level cell.

Referring to FIG. 3, a multi-level cell may have an erase state ER, a first program state 32, a second program state 33 or a third program state 34 based on a threshold voltage distribution. To program memory cells having the erase state ER to one of the first, second and third program states 32, 33 and 34, a least significant bit (LSB) program operation and a most significant bit (MSB) program operation may be performed thereon. The LSB program operation may be performed on memory cells to be, programmed to one of the second or third program states 33 or 34, among the memory cells having the erase state ER. Therefore, a threshold voltage distribution 31 of the memory cells on which the LSB program operation is performed may have a large width between a threshold voltage distribution of memory cells having the first program state 32 and a threshold voltage distribution of memory cells having the third program state 34.

The MSB program operation may be performed on memory cells to be programmed to the first program state 32, among the memory cells having the erase state ER, or memory cells to be programmed to the second or third program state 33 or 34, among the memory cells on which the LSB program operation is performed. A read voltage may include a first read voltage $V_{M1}$ to differentiate the memory cells having the first program state 32, a second read voltage $V_{M2}$ to differentiate the memory cells having the second program state 33, and a third read voltage $V_{M3}$ to differentiate the memory cells having the third program state 34. The second read voltage $V_{M2}$ may also be used to perform an operation to determine whether the selected memory block is an erased memory block, an LSB programmed memory block, or an MSB programmed memory block (hereinafter, "source line voltage detection operation").

The source line voltage detection operation may be performed to compare a voltage detected from the source line with a reference voltage corresponding to the selected memory block and determine which state the selected memory block is in based on a result of comparison.

Figure 4:
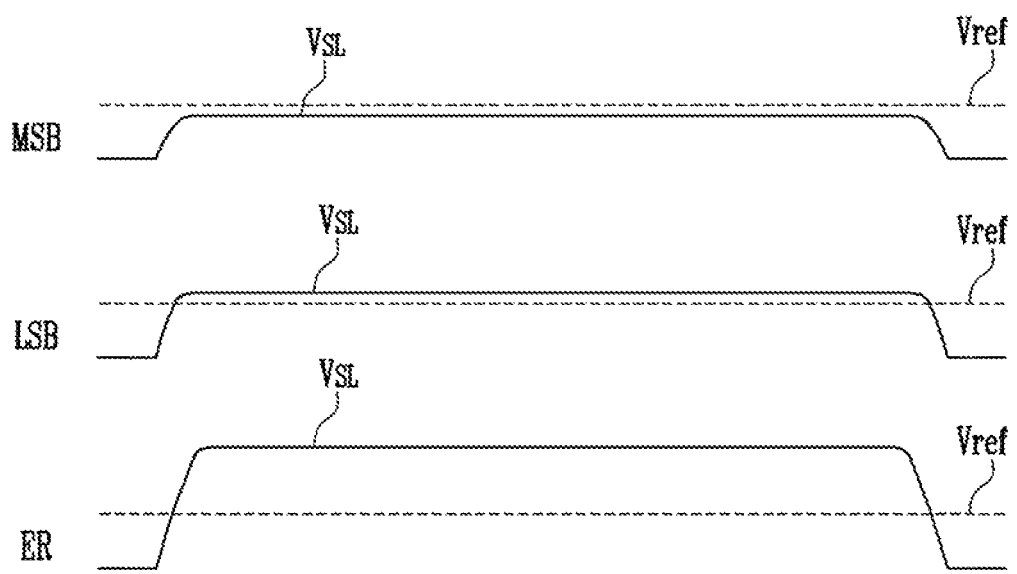
FIG. 4 is a view illustrating source voltage difference depending on a program state of a memory cell.

FIG. 4 is a view illustrating a source line voltage difference depending on a program state of a memory cell.

Referring to FIG. 4, a source line voltage $V_{SL}$ may have a different level depending on a state (ER, LSB or MSB) of the selected memory block. The source line voltage $V_{SL}$ may refer to a voltage of the source line SL shown in FIG. 2 when the bit lines BL shown in FIG. 2 are precharged, and a read voltage is applied to a selected word line, which is one of the word lines WL0 to WLn shown in FIG. 2, and a pass voltage is applied to the remaining word lines, except for the selected word line, and a turn on voltage is applied to the drain and source selection lines DSL and SSL shown in FIG. 2.

When the selected memory block is in the erase state ER, all memory cells included in the selected page may have the erase state. Therefore, a precharge voltage applied to the bit lines BL may be transferred to the source line SL, so that the source line voltage VSL may be increased.

When the LSB program operation is completed and the MSB program operation is not performed on the selected memory block, the selected memory block is in the LSB program state (LSB). The selected page of the selected memory block has approximately equal proportions of memory cells having the erase state ER and memory cells on which the LSB program operation is completed. The LSB and MSB program operation may be performed by using a random program method to distribute the memory cells having the erase state ER and the memory cells having the LSB program state (LSB) in substantially similar proportions.

According to a random program method, external input data may be randomized so that memory cells in which data is stored may be evenly distributed in the selected memory block. This random program method is generally used, and there are various randomization methods. Thus, a detailed description thereof is omitted. When an LSB or MSB program operation is performed on a memory block in the random program method, memory cells having an erase state and memory cells programmed to different states may be distributed in substantially similar proportions. In other words, when a first LSB program operation is performed on the selected memory block and a second LSB program operation is performed thereon, memory cells having an erase state and programmed memory cells are always maintained in substantially similar proportions (e.g., in a ratio of 1:1) in the selected memory block. For example, when 1,024 memory cells are included in the selected page of the selected memory block, approximately 512 memory cells having the erase state and approximately 512 memory cells having the LSB program state (LSB) may be present in the selected page after the LSB program operation of the selected page is completed.

As described above, since the memory cells having the erase state and the memory cells having the program state are present in substantially similar proportions, the source line voltage $V_{SL}$ may be maintained at a predetermined level in each of the erase state ER, the LSB program state (LSB), and the MSB program state (MSB). For example, when a level of the source line voltage $V_{SL}$ of a memory block in the erase state ER is defined as a first level, a level of the source line voltage $V_{SL}$ of a memory block having the LSB program state (LSB) may have a second level lower than the first level, and a level of the source line voltage $V_{SL}$ of the memory block having the MSB program state (MSB) may have a third level lower than the second level.

In other words, since all memory cells of the selected memory block in the erase state ER have the erase state, most of the precharge voltage applied to the bit lines BL may be transferred to the source line. SL, so that significant voltage bouncing may occur in the source line. Therefore, the source line voltage may have a first level which is the highest. In the LSB program state (LSB in which the LSB program operation is completed, approximately half the memory cells of the selected memory block may exist as LSB-programmed memory cells, so that bouncing occurring in the source line may be less than that in the erase state ER. Therefore, the source line voltage of the memory block having the LSB program state (LSB) may have a second level that is lower than the first level. In the MSB program state (MSB) in which the MSB program operation is completed, three quarters of the memory cells of the selected memory block exist as MSB-programmed memory cells. Therefore, bouncing occurring in the source line may be less than that in the LSB program state (LSB). Therefore, the source line voltage of the memory block having the MSB program state (MSB) may have a third level that is lower than the second level.

In order to distinguish the above-described difference in level, the reference voltage Vref may be set for each of the memory blocks. The reference voltage Vref may be set beforehand by performing a test operation on the semiconductor device. In addition, the reference voltage Vref may vary between the memory blocks in consideration of the difference in loading of the bit lines BL. In addition, the above-described reference voltage Vref may vary according to a test read voltage applied to a selected word line during a test operation. However, the second read voltage $VM_2$ shown in FIG. 3 may be used as the test read voltage consideration of the threshold voltage distribution of the memory cells by the LSB and MSB program operation. For example, the test operation may be performed on each of the memory blocks and the reference voltage Vref may be set between source line voltages measured in the LSB-programmed state and the MSB-programmed state of each of the memory blocks. During the test operation, a channel may be formed by applying the test read voltage to the selected word line of the selected memory block and a pass voltage to the remaining word lines. Subsequently, a turn-on voltage may be applied to drain and source selection lines so that a voltage of the precharged bit lines may be transferred to the channel. The reference voltage Vref may be set to differentiate a memory block on which the LSB program operation or the MSB program operation is completed according to the voltage of the source line.

In FIG. 4, the description is made in reference to the voltage (VSL) of the source line as an example. However, a difference in current of the source line may be used. When source line current is used, the largest current may flow through the source line in the memory block having the erase state ER, and the source line current may have the highest level. The source line current may have an intermediate level in the memory block having the LSB program state (LSB). The source line current may have the lowest level in the memory block having the MSB program state (MSB).

A read operation based on the above description is as follows.

FIG. 5 is a flowchart illustrating a read operation according to an embodiment.

Referring to FIG. 5, when a request to perform a read operation on a selected page of the selected memory block is applied to the control circuit 130 shown in FIG. 1, the control circuit 130 may control the peripheral circuit 120 shown in FIG. 1 to perform a source line voltage detection operation (51, 52, 53 and 54) and perform a read operation (55 or 56) on the selected page in response to a result of the source line voltage detection operation (51, 52, 53 and 54). The source line voltage detection operation (51, 52, 53 and 54) and the read operation (55 or 56) are described below in detail.

When the read operation of the selected page starts, the peripheral circuit 120 shown in FIG. 1 may be controlled to precharge the bit lines BL and the word lines WL (51). However, a selected word line coupled to the selected page, among the word lines WL, may be precharged to the second read voltage $V_{M2}$ shown in FIG. 3, and the remaining word lines may be precharged to a pass voltage that is greater than the second read voltage $V_{M2}$.

The reference voltage Vref corresponding to the selected memory block may be generated (52). The memory cell array 110 shown in FIG. 1 may include a plurality of memory blocks. The reference voltage Vref may be set for each of the memory blocks.

FIG. 6 is a view illustrating a reference voltage.

Referring to FIG. 6, the reference voltage Vref corresponding to each of the zeroth to i-th memory blocks BLK0 to BLKi may be set. For example, the reference voltage Vref having a level 'a0' may be set to the zeroth memory block BLK0, and the reference voltage Vref having a level 'a1' may be set to a first memory block BLK1, and the reference voltage Vref having a level 'ai-1' may be set to an i-1-th memory block BLKi-1, and the reference voltage Vref having a level 'ai' may be set to an i-th memory block BLKi. Data of the reference voltage Vref corresponding to each of the memory blocks may be stored in the reference voltage generation circuit 220 of FIG. 1. The reference voltage generation circuit 220 may receive the block address BLOCK_ADD from the control circuit 130 shown in FIG. 1, and generate the reference voltage Vref in response to the transferred block address BLOCK_ADD.

Referring again to FIG. 5, when the reference voltage Vref of the selected memory block is generated, the source line voltage $V_{SL}$ of the selected memory block may be detected (53). For example, the source line voltage detection circuit 210 shown in FIG. 1 may detect the source line voltage $V_{SL}$ of the memory cell array 110 in response to the detection enable signal DET_EN. To detect the source line voltage $V_{SL}$, a turn-on voltage may be applied to the drain and source selection lines DSL and SSL shown in FIG. 2. Since the selected word line is precharged to the second read voltage VM2, the source line voltage $V_{SL}$ may be changed in response to threshold voltages of the memory cells included in the selected page.

Subsequently, the detected source line voltage $V_{SL}$ and the reference voltage Vref may be compared with each other (54). When the source line voltage $V_{SL}$ is determined to be greater than the reference voltage Vref, the LSB read operation of the selected page may be performed since the LSB program operation is performed and the MSB program operation is not performed on the selected memory block (55).

When the source line voltage $V_{SL}$ is determined to be lower than the reference voltage Vref, the MSB read operation of the selected page may be performed since the MSB program operation is performed on the selected memory block (56).

As described above, although each of the memory blocks does not include flag cells storing data indicating whether an SSB or MSB program operation is completed, a state of the selected memory block may be determined by comparing the source line voltage $V_{SL}$ with the reference voltage Vref corresponding to the selected memory block. Therefore, since the number of flag cells included in each of the memory blocks is reduced, the size of the memory cell array may be reduced, and the size of the semiconductor device may be reduced.

Figure 7:
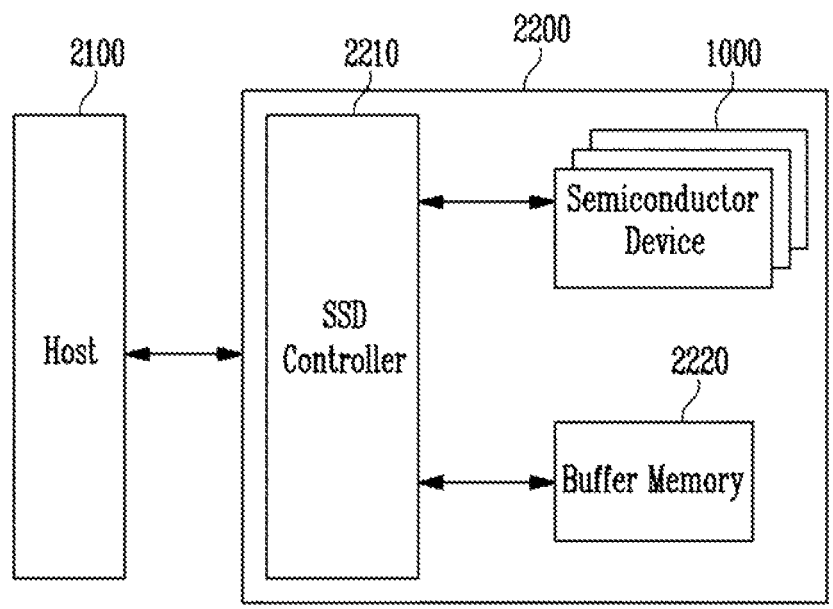
FIG. 7 is a block diagram illustrating a solid state drive including a semiconductor device according to an embodiment.

FIG. 7 is a block diagram illustrating a solid state drive including a semiconductor device according to an embodiment of the present invention.

Referring to FIG. 7, a drive device 2000 may include a host 2100 and a solid state drive (SSD) 2200. The SSD 2200 may include an SSD controller 2210, a buffer memory 2220 and a semiconductor device 1000.

The SSD controller 2210 may provide a physical connection between the host 2100 and the SSD 2200. In other words, the SSD controller 2210 may perform interfacing with the SSD 2200 in response to a bus format of the host 2100. The SSD controller 2210 may decode a command provided from the host 2100. According to a decoding result, the SSD controller 2210 may access the semiconductor device 1000. As the bus format of the host 2100, Universal Serial Bus (USB), Small Computer System Interface (SCSI), Peripheral Component Interconnect Express (PCI-E), Advanced Technology Attachment (ATA), Parallel ATA (PATA), Serial ATA (SATA), and Serial Attached SCSI (SAS) may be included.

The buffer memory 2220 may temporarily store program data provided from the host 2100 or data read from the semiconductor device 1000. When a read request is made by the host 2100 and data in the semiconductor device 1000 is cached, the buffer memory 2220 may support a cache function to directly provide the cached data to the host 2100. In general, data transfer speed by the bus format (for example, SATA or SAS) of the host 2100 may be higher than the transfer speed of a memory channel of the SSD 2200. In other words, when the interface speed of the host 2100 is higher than the transfer speed of the memory channel of the SSD 2200, performance degradation caused by the speed difference may be minimized by providing the buffer memory 2220 having a large capacity. The buffer memory 2220 may be provided as synchronous DRAM for sufficient buffering in the SSD 2200.

The semiconductor device 1000 may be provided as a storage medium of the SSD 2200. For example, the semiconductor device 1000 may be provided as a nonvolatile memory device having large storage capacity as described above in detail with reference to FIG. 1. The semiconductor device 1000 may be a NAND-type flash memory.

Figure 8:
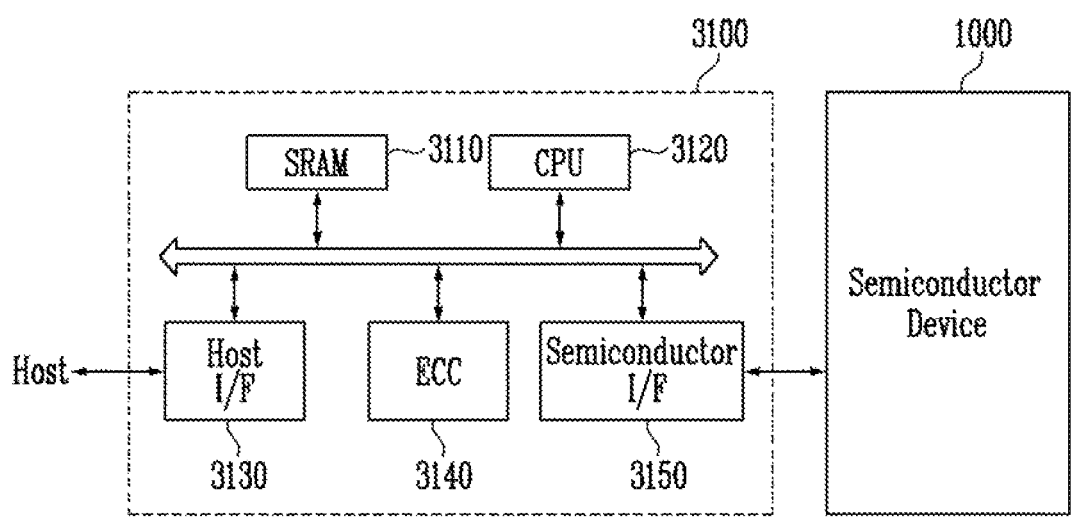
FIG. 8 is a block diagram illustrating a memory system including a semiconductor device according to an embodiment.

FIG. 8 is a block diagram illustrating a memory system including a semiconductor device according to an embodiment of the present invention.

Referring to FIG. 8, a memory system 3000 according to an embodiment may include a memory control unit 3100 and the semiconductor device 1000.

Since the semiconductor device 1000 may have substantially the same configuration as shown in FIG. 1, a detailed description thereof may be omitted.

The memory control unit 3100 may be configured to control the semiconductor device 1000. An SRAM 3110 may be used as a working memory of a CPU 3120. A host interface (I/F) 3130 may include a data exchange protocol of a host electrically coupled with the memory system 3000. An error correction code circuit (ECC) 3140 in the memory control unit 3100 may detect and correct an error in data read from the semiconductor device 1000. A semiconductor I/F 3150 may interface with the semiconductor device 1000. The CPU 3120 may perform a control operation for data exchange of the memory control unit 3100. In addition, although not illustrated in FIG. 8, a ROM for storing code data for interfacing with a host may be provided in the memory system 3000.

In an embodiment, the memory system 3000 may be applied to one of a computer, an Ultra Mobile PC (UMPC), a workstation, a net-book, a PDA, a portable computer, a web tablet, a wireless phone, a mobile phone, a smartphone, a digital camera, a digital audio recorder, a digital audio player, a digital picture recorder, a digital picture player, a digital video recorder, a digital video player, a device of transmitting and receiving information in a wireless environment, and various devices constituting a home network.

Figure 9:
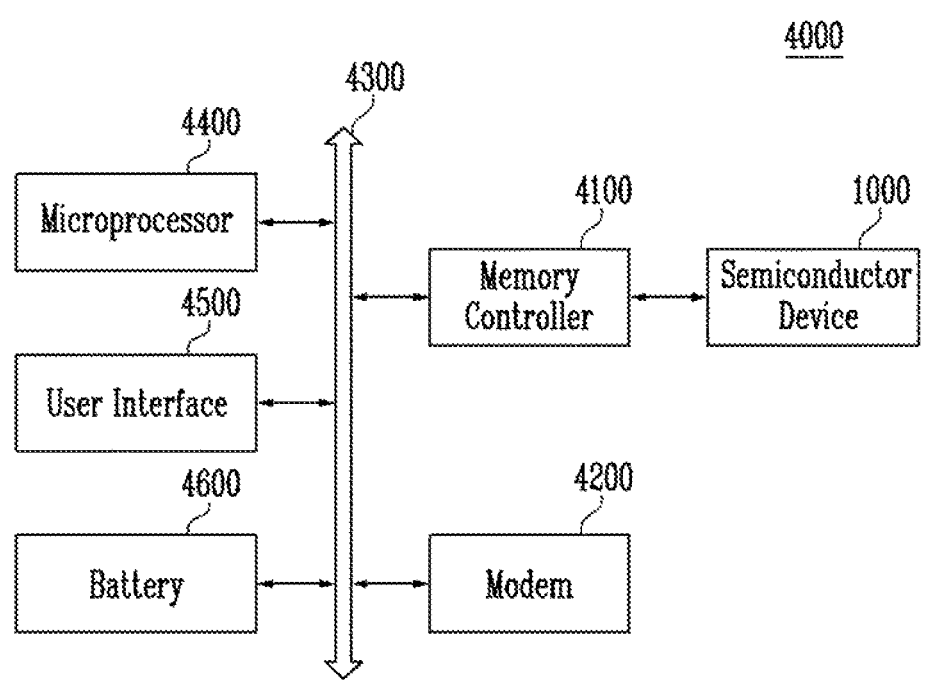
FIG. 9 is a view illustrating a schematic configuration of a computing system including a semiconductor device according to an embodiment.

FIG. 9 is a block diagram illustrating a computing system including a semiconductor device according to an embodiment of the present invention.

Referring to FIG. 9, a computing system 4000 includes a semiconductor device 1000, a memory controller 4100, modem 4200, a microprocessor 4400, and a user interface 4500, which are electrically coupled to a bus 4300. When the computing system 4000 is a mobile device, a battery 4600 for supplying an operation voltage of the computing system 4000 may be additionally provided. The computing system 4000 may include an application chip set (not shown), a camera image processor (CIS) (not shown), a mobile DRAM (not shown), and the like.

The semiconductor device 1000 may be configured in substantially the same manner as the semiconductor device 1000 shown in FIG. 1. Thus, a detailed description thereof will be omitted.

The memory controller 4100 and the semiconductor device 1000 may be components of a Solid State Drive/Disk (SSD).

The semiconductor device 1000 and the memory controller 4100 may be mounted using various types of packages. For example, the semiconductor device 1000 and the memory controller 4100 may be mounted using packages such as Package on Package (PoP), Ball Grid Array (BGA), Chip Scale Package (CSP), Plastic Leaded Chip Carrier (PLCO), Plastic Dual In-line Package (PDIP), Die in Waffle Pack (DWP), Die in Wafer Form (DWF), Chip On Board (COB), Ceramic Dual In-line Package (CERDIP), plastic Metric Quad Flat Pack (MQFP), Thin Quad Flat Pack (TQFP), Small Outline Integrated Circuit (SOIC), Shrink Small Outline Package (SSOP), Thin Small Outline package (TSOP), System In Package (SIP), Multi Chip Package (MCP), Wafer-level Fabricated Package (WFP), Wafer-level processed Stack Package (WSP), and the like.

According to an embodiment, flag cells storing LSB/MSB completion data may be eliminated by using voltage or current of a source line, so that the size of semiconductor device may be reduced.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. An operating method of a semiconductor device, the operating method comprising:
applying a read voltage to a selected word line of a selected memory block, among a plurality of memory blocks including cell strings coupled between bit lines and a source line;
detecting a voltage of the source line by forming a channel in cell strings of the selected memory block;
comparing the voltage of the source line with a reference voltage corresponding to the selected memory block; and
performing a least significant bit (LSB) read operation on memory cells coupled to the selected word line when the voltage of the source line is greater than the reference voltage, as a result of the comparing, and performing a most significant bit (MSB) read operation on the memory cells when the voltage of the source line is less than the reference voltage, as the result of the comparing.

2. The operating method of claim 1, wherein the applying of the read voltage comprises:
applying a pass voltage to remaining word lines, except the selected word line, among word lines of the selected memory block.

3. The operating method of claim 1, wherein the reference voltage is set for each of the memory blocks.

4. The operating method of claim 3, further comprising:
performing a test operation on each of the memory blocks to set the reference voltage for each of the memory blocks.

5. The operating method of claim 4, wherein the performing of the test operation comprises:
precharging the bit lines;
applying a test read voltage to the selected word line and a pass voltage to remaining word lines to form a channel;
transferring a voltage of the bit lines to the channel; and
setting the reference voltage based on the voltage of the source line.

6. The operating method of claim 5, wherein the reference voltage is set between a source line voltage measured from a memory block having an LSB-programmed state and a source line voltage measured from a memory block having an MSB-programmed state.

7. The operating method of claim 1, further comprising, before the detecting of the voltage of the source line:
generating the reference voltage corresponding to the selected memory block.

8. An operating method of a semiconductor device, the operating method comprising:
applying a read voltage to a selected word line of a selected memory block, among a plurality of memory blocks including cell strings coupled between bit lines and a source line;
detecting a current of the source line by forming a channel in cell strings of the selected memory block;
comparing the current of the source line with a reference current corresponding to the selected memory block; and
performing a least significant bit (LSB) read operation on memory cells coupled to the selected word line when the current of the source line is greater than the reference current, as a result of the comparing, and performing a most significant bit (MSB) read operation on the memory cells when the current of the source line is less than the reference current, as the result of the comparing.

9. The operating method of claim 8, wherein the reference current is set when a test operation is performed on the selected memory block.

10. The operating method of claim 9, wherein the reference current is set between a source line current measured when the selected memory block has an LSB-programmed state and a source line current measured when the selected memory block has an MSB-programmed state during the test operation.

11. The operating method of claim 9, further comprising, before the detecting of the current of the source line:
generating the reference current corresponding to the selected memory block.

12. A semiconductor device, comprising:
a plurality of memory blocks including a plurality of cell strings coupled between bit lines and a source line;
a peripheral circuit suitable for performing program, read and erase operations on a selected memory block, among the plurality of memory blocks;
a source line check circuit suitable for measuring a voltage or current of the source line, comparing the voltage or current of the source line with a reference voltage or current, and outputting a comparison result during the read operation of the selected memory block, among the plurality of memory blocks; and
a control circuit suitable for controlling the source line check circuit to compare the reference voltage or current of the selected memory block with the voltage or current of the source line and controlling the peripheral circuit to perform the read operation on the selected memory block based on the comparison result,
wherein the control circuit controls the peripheral circuit to perform a least significant bit (LSB) read operation on memory cells of the selected memory block when the voltage or current of the source line is greater than the reference voltage or current, and perform a most significant bit (MSB) read operation on the memory cells when the voltage or current of the source line is less than the reference voltage or current.

13. The semiconductor device of claim 12, wherein the source line check circuit comprises:
a reference voltage or current generation circuit suitable for generating the reference voltage or current corresponding to the selected memory block in response to a detection enable signal and a block address output from the control circuit; and
a source line detection circuit detecting the voltage or current of the source line in response to the detection enable signal, comparing the reference voltage or current with the voltage or current of the source line, and outputting a program state signal as the comparison result.

14. The semiconductor device of claim 13, wherein the reference voltage or current generation circuit includes:
a storage unit suitable for storing data relating to the reference voltage or current corresponding to each of the memory blocks.

15. The semiconductor device of claim 12, wherein the peripheral circuit performs LSB and MSB programs by determining an LSB program state or an MSB program state using the voltage of the source line and the reference voltage, and performs the LSB and MSB read operations using the voltage or current of the source line.

\* \* \* \* \*